United States Patent
Havlik et al.

(10) Patent No.: US 10,126,557 B2
(45) Date of Patent: Nov. 13, 2018

(54) PROJECTION SYSTEM FOR GENERATING SPATIALLY MODULATED LASER RADIATION AND OPTICAL ARRANGEMENT FOR TRANSFORMING LASER RADIATION

(71) Applicant: Jabil Optics Germany GmbH, Jena (DE)

(72) Inventors: Mojmir Havlik, Jena (DE); Thomas Beyer, Jena (DE)

(73) Assignee: Jabil Optics Germany GmbH, Jena (DE)

( * ) Notice: Subject to any disclaimer, the term of this patent is extended or adjusted under 35 U.S.C. 154(b) by 0 days.

(21) Appl. No.: 15/380,540

(22) Filed: Dec. 15, 2016

(65) Prior Publication Data

US 2017/0176757 A1 Jun. 22, 2017

(30) Foreign Application Priority Data

Dec. 18, 2015 (DE) .......................... 10 2015 122 266

(51) Int. Cl.
| | | |
|---|---|---|
| *G02B 26/00* | (2006.01) | |
| *G02B 27/09* | (2006.01) | |
| *H01S 5/00* | (2006.01) | |

(52) U.S. Cl.
CPC ..... *G02B 27/0927* (2013.01); *G02B 27/0916* (2013.01); *G02B 27/0955* (2013.01);
(Continued)

(58) Field of Classification Search
CPC ................ G02B 27/09; G02B 27/0955; G02B 27/0983; G02B 27/0916; G02B 6/32; H01S 5/00; H01S 5/0071; H01S 5/0085
(Continued)

(56) References Cited

U.S. PATENT DOCUMENTS 7,283,702 B2 * 10/2007 Brosnan ................... G02B 6/32
359/708
7,864,429 B2 1/2011 Muenz et al.
(Continued)

FOREIGN PATENT DOCUMENTS

| | | |
|---|---|---|
| DE | 4231489 A1 | 3/1994 |
| DE | 102004034966 A1 | 2/2006 |
| DE | 112005003207 B4 | 10/2014 |

*Primary Examiner* — Euncha Cherry
(74) *Attorney, Agent, or Firm* — Volpe and Koenig, P.C.

(57) ABSTRACT

Described is an arrangement for the transformation of laser radiation. A projection system for generating spatially modulated laser radiation includes an optical arrangement for transforming laser radiation, a field lens, a spatial light modulator and a projection arrangement. By means of the optical arrangement, incidental laser radiation in a first direction (E) is reflected on an aspherically curved, reflective surface in a second direction (R), where in a plane perpendicular to the first direction (E) the laser radiation has an inhomogeneous beam profile (GB1, G2) with a first beam axis (A) and a second beams axis (B) perpendicular to the latter, and the aspherical curvature is designed, during the reflection on the reflective surface, to transform the inhomogeneous beam profile of the laser radiation for the first beam axis (A) and/or the second beam axis (B) respectively into a homogenous top-hat beam profile (H).

19 Claims, 5 Drawing Sheets

(52) U.S. Cl.
CPC ........ *G02B 27/0983* (2013.01); *H01S 5/0071* (2013.01); *H01S 5/0085* (2013.01)

(58) Field of Classification Search
USPC .......................................... 359/238
See application file for complete search history.

(56) References Cited

U.S. PATENT DOCUMENTS

| | | |
|---|---|---|
| 2001/0010702 A1 | 8/2001 | Tanaka |
| 2006/0012891 A1 | 1/2006 | Goelles et al. |
| 2007/0217740 A1 | 9/2007 | Brosnan et al. |

\* cited by examiner

PROJECTION SYSTEM FOR GENERATING SPATIALLY MODULATED LASER RADIATION AND OPTICAL ARRANGEMENT FOR TRANSFORMING LASER RADIATION

FIELD OF INVENTION

The invention relates to a projection system for generating spatially modulated laser radiation and an optical arrangement for transforming laser radiation. In particular, the present invention relates to a projection system for generating spatially modulated laser radiation with an optical arrangement for transforming the radiation of a single mode laser, wherein a known radiation profile of the single mode laser can be transformed by means of reflection on a curved, reflective surface into any other beam profile, for example a rectangular beam profile with a top-hat intensity distribution.

BACKGROUND

Due to their particular properties, laser light sources are increasingly replacing classical light sources. Compared to light-emitting diodes (LEDs), laser diodes (LDs) are particularly characterised in that the latter can be significantly more efficient and more powerful. In addition, by having a low spectral bandwidth and by means of the high spatial and temporal coherence of the emitted radiation, completely new fields of application can be tapped into. This is of particular relevance to the field of mobile devices (smartphones), as energy-efficient projection systems or high performance laser scanners, for example, can be integrated into said devices for scanning the surroundings.

However, for some applications LDs have a significant disadvantage over LEDs. Whereas LEDs are so-called surface emitters, the radiated light of which can be collimated and/or focussed by simple lenses, laser diodes are generally Gaussian emitters in which the spatial brightness distribution of the emitted light is described by a Gaussian distribution. However, in many cases it is preferable for illumination purposes to have a distribution of the intensity in the beam that is as homogenous as possible, so that here there often needs to be a complicated transformation of the beam profile into a rectangular profile (top-hat or flat-top). In laser scanners, however, sharp lines or grid profiles are often particularly preferred beam shapes.

In edge-emitting laser diodes a further complicating factor is that the beam profile emitted by the diode also often differs in horizontal and vertical direction (slow and fast-moving laser axis). For a mutual adjustment of both said axes additional cylindrical lens arrangements are often therefore required in the beam path. However, such a beam shaping or transformation may also be necessary with other laser light sources. For example, surface-emitting laser diodes can also have a very inhomogeneous radiation profile. This then must also be adjusted in a laborious manner by suitable lenses according to the respective requirements.

In U.S. Pat. No. 7,532,651 B2 an illuminating system for optical modulators is described, in which a phase plate and a lens are used for the efficient illumination of a microelectromechanical (MEMS) modulator array by beam transformation. However, such an arrangement is only suitable to a limited degree for integration into inexpensive mobile devices, as here a plurality of optical components with a corresponding space requirement have to be combined with one another to fit as accurately as a possible. When using lenses in a lighting system, a miniaturisation of the corresponding assembly is substantially limited by the focal lengths of the individual lenses. However, in addition to the total length of the beam path, lenses also have the disadvantage that their surfaces have to be made anti-reflective at great expense to avoid scattering effects. In this way the spectral properties of the optical system are often significantly limited, so that the use of the latter is set to specific wavelength ranges. In addition, in some applications particular demands are also made of the quality of the individual surfaces, their tempering and the applied coatings, which is reflected in the manufacturing costs and also the cost of construction. Additionally, the requirements relating to the centricity of the beam path and the long-term stability of the individual assembly are typically problematic for the integration of optical elements into compact mobile devices. For example, when using inexpensive plastic lenses, if there is a change in the operating temperature of the device a significant variation in the effective focal length of the lens is often noted. The reason for this is in particular that the refractive index of optical plastic materials is relatively temperature-dependent and therefore it is possible in the temperature ranges common for such devices that much more noticeable mapping errors may occur.

Therefore, the objective of the invention is to provide a projection system for generating spatially modulated laser radiation with an optical arrangement for transforming the radiation of a single mode laser, which avoids one or more of the said problems of the prior art on transforming beam profiles for lighting purposes or at least significantly reduces the latter. In particular, a projection system for generating spatially modulated laser radiation can be provided with an optical arrangement for the transformation of the radiation of a single mode laser, which enables a particularly compact and robust structure with a minimum number of optical components, wherein the optical properties are supposed to be stable over a broad temperature range and the useable wavelength range is not restricted by additional anti-reflective coatings.

SUMMARY

The said objective is achieved by means of the projection system according to the invention as claimed in claim 1. The invention provides a projection system for generating spatially modulated laser radiation. The projection system comprises an optical arrangement for transforming laser radiation, a field lens, a spatial light modulator, and a projection arrangement. As a result of the optical arrangement, incidental laser radiation in a first direction is reflected on an aspherically curved, reflective surface in a second direction, wherein the laser radiation in a plane perpendicular to the first direction has an inhomogeneous beam profile with a first beam axis and a second beam axis perpendicular to the latter and the aspherical curvature is designed, during the reflection on the reflective surface, to transform the inhomogeneous beam profile of the laser radiation for the first beam axis and/or for the second beam axis respectively into a homogenous top-hat beam profile.

By using LDs instead of conventional light sources in projection systems, such as conventional halogen lamps or LEDs, a much more efficient and powerful illumination of a spatial light modulator can be achieved. However, in order to generate a large area intensity distribution which is as homogenous as possible with LDs, the beam profile emitted by the LDs is firstly homogenised prior to modulation and adjusted in form to the spatial light modulator. In order to thus achieve a form that is as compact as possible, the respective bean paths can be folded spatially by a plurality of suitable redirections by one or more mirrors.

The invention is based on the finding that the mirror used with such a spatial folding of the beam path can be provided by a suitable aspherical curvature of its reflective surface with additional optical functionalities. In particular, the mirror can be used for the reflection of the radiation incidental to the latter for shaping the beam or for transforming the beam. In this way, compact and extremely powerful projection systems can be obtained for which a minimal number of optical components is sufficient in the smallest possible space. Since a beam transformation according to the invention is also performed on a reflective surface it is possible to avoid having an expensive and antireflective coating. Furthermore, particularly when using a metal reflective layer (e.g. gold or silver), a high spectral bandwidth is achieved, which is not subject to the usual restrictions of a conventional layer system. The individual components of the projection system can also be made from materials that are optically and mechanically stable with regards to temperature, so that a particularly stable and inexpensive structure of the projection system can be ensured in all possible conditions.

The reflective surface has an aspherical curvature if the form of the surface differs at least partly from the general form of a sphere or a single planar surface. Although aspherical curvatures can only be obtained during the manufacture of optical components with increased technical effort compared to planar or spherical surfaces, aspherical curvatures often achieve a significant increase in the optical mapping quality. In particular, by means of a suitable design of the local curvature parameter, it is possible to achieve a specific adjustment of the reflection properties. Aspherical surface elements, for example, can be off-axis sections of conical sections (circle, ellipse, parabola, hyperbola). In addition, correction polynomials for taking higher order curvatures into consideration are also often taken into account. In order to enable the optimum adaptation of the local curvature parameters to the intensity distribution of the incidental laser radiation, surface elements freely defined in all dimensions can also be used for surface structuring. In particular, the use of one or more free-form surfaces for the design of the aspherical curvature of the reflective surface is particularly preferred.

The laser radiation emitted by an edge-emitting LD typically has a Gaussian or virtually Gaussian beam profile with an inhomogeneous intensity distribution with a significant weighting of the intensity to the centre of the beam cross-section. In particular, the profile, due to diffraction effects in a plane perpendicular to the beam axis, shows different propagation behaviour along a first beam axis and a second beam axis perpendicular thereto. Both axes are often referred to as rapid-moving and slow-moving axes due to their different propagation behaviour. However, there is also Gaussian or approximately Gaussian laser radiation with a radially symmetrical intensity profile. By way of example, this can be generated by a solid-state laser or a surface-emitting LD.

Radiation is considered inhomogeneous to a beam axis if there is a significant intensity modulation within certain tolerances in the beam axis within the beam diameter. Such a modulation can be provided, for example, by the intensity profile of a laser beam with a Gaussian intensity profile or by a spatially inhomogeneous intensity distribution of a multimode laser. Radiation is considered homogenous relative to a beam axis where said modulation is extremely low or not very pronounced. An example of a homogenous intensity distribution is a flat top-hat beam profile, which is characterised in that within the beam diameter there is a substantially uniform intensity distribution and the beam profile is characterised by a virtually dramatic increase or drop in intensity in the outer area of the beam profile.

In laser technology, the beam diameter is typically defined by a percentage power inclusion. In Gaussian beams and rotationally symmetric Gaussian-like power density distributions, the beam diameter is mostly determined by a power inclusion of 86.5%, and in top-hat similar power density distributions by a power inclusion of 95%. Therefore, a particularly preferred top-hat-like power density distribution is particularly characterised in that the respective beam diameter corresponds approximately to the distance between the two intensity flanks of the beam profile in the associated beam axis.

In the projection system according to the invention, homogenous radiation generated by transformation from inhomogeneous radiation with a top-hat beam profile can be used for illuminating a spatial light modulator. For example, this can include reflective or transmitting modulators based on an MEMS or LCD. It is particularly preferable if the illumination and mapping of the spatially modulated light field is performed by a common optical component in the form of a field lens. If in this case the spatial light modulator and the field lens are arranged directly behind one another, there can be an additional folding of the beam path in this way for a further simplification and compacting of the projection system. The spatially modulated initial beam can then be supplied to a suitable projection arrangement. Such a projection arrangement can include a lens system adjusted to the light field in particular or also an individual lens. In a particularly preferred embodiment of the projection arrangement, the latter can also be a suitably adapted prism arrangement for further beam directing in any additional spatial axis. In particular, the projection system according to the invention can be essentially a sequential optical structure located mainly in one plane, in which a spatial tilting or rotation of the light field exiting the projection system is achieved by means of a prism arrangement.

According to a further aspect of the present invention, an optical arrangement is provided for transforming laser radiation. The optical arrangement comprises a laser light source, which emits laser radiation along a laser axis, wherein in a plane perpendicular to the laser axis the laser radiation has an inhomogeneous beam profile with a first beam axis and a second beam axis perpendicular thereto, and a reflective surface to which the laser radiation is directed in a first direction. The reflective surface is thereby curved aspherically such that the laser radiation is reflected along a second direction and the aspherical curvature is designed, during the reflection on the reflective surface, to transform the inhomogeneous beam profile of the laser radiation for the first beam axis and/or for the second beam axis respectively into a homogenous top-hat beam profile.

The proposed optical arrangement for transforming laser radiation can be used in particular in a projection system according to the invention as claimed in claim 1. It comprises a suitable laser light source, for example an edge-emitting LD and an aspherically curved reflective surface adjusted to the respective radiation properties of the laser light source with precisely determined properties defined over the local curvature by means of asphere parameters for the beam transformation from an inhomogeneous to a homogenous top-hat beam profile can be used. The focus here is not necessarily the even and large area illumination of a specific target structure, but rather the underlying transformation behaviour of the radiation. In particular, it is also possible in this case to generate homogeneous line profiles with very different beam diameters in the two beam axes, beams with different propagation properties in the two beam axes, beam distortions by different propagation directions and any combinations from this group.

In a preferred embodiment of the invention, after the reflection on the reflective surface within the beam diameter of the homogeneous top-hat beam profile, the ratio between the minimum and maximum intensity for the first beam axis A and for the second beam axis B respectively is at least 0.8. This means that along a fixed beam axis within a linear radiation range defined by the respective beam radius there is an intensity modulation below 20% of the maximum peak intensity in this range.

In a further preferred embodiment of the invention, the laser light source includes a single mode laser and the emitted laser radiation for the first beam axis has a minimum divergence and for the second beam axis it has a maximum divergence, or the divergence for both beam axes is identical. In principle, in this way the spatial position of the two axes is determined, to which the configuration of the respective aspherical curvatures in said axes relates. In particular, the two divergences can relate to the respective divergence of the rapidly-moving and the slow-moving axis of an edge-emitting LD or the radially symmetrical divergence of a radially symmetrically radiating surface emitting LD.

In a further preferred embodiment of the invention, the reflective surface is curved bi-spherically, wherein the first aspherical curvature is assigned to the first beam axis and the second aspherical curvature is assigned to the second beam axis. This means that the aspherical curvature of the reflective surface has a curvature, which is parallel to the direction of the first beam axis and to the direction of the second beam axis, with uniform curvature behaviour. The curvature can thus be fully delineated along the first and second beam axis by two independent, i.e. not coupled, one-dimensional apsherical equivalents.

In a further preferred embodiment of the invention, after the reflection of the radiation on the reflective surface, the variance between the divergence of the first beam axis and the second beam axis is below 0.01. In this embodiment according to the invention there can be an alignment of the two propagation parameters of said beam axes, for example in the divergence between a rapidly-moving and a slow-moving axis of a laser light source. In particular, in this embodiment it is possible to achieve a virtually distortion-free illumination of an area largely independently of the optical path covered.

In a further preferred embodiment of the invention, the reflective surface comprises at least one free-form surface. This corresponds substantially to the general definition of an asphere without any possible functional limitation to specific types of conical sections or higher order correction factors.

In a further preferred embodiment of the invention, the laser light source has a first Gaussian or approximately Gaussian beam profile in the first beam axis and a second Gaussian or approximately Gaussian beam profile in the second beam axis. In particular, the laser radiation in the two beam axes can have different $M^2$ values. It is also possible to have higher order Gaussian beam profiles in one axis or in both axes. All profiles which have roughly a bell shape are considered to be approximately Gaussian. In particular, also Lorentz, Voigt and pseudo-Voigt profiles are considered to be approximately Gaussian or approximable by a Gaussian function.

In a further preferred embodiment of the invention, the radiation emitted by the radiation source has an ellipsoid beam profile and the radiation reflected by the reflective surface has a rectangular or different beam profile. The first and second beam axis can be assigned as main axes to an ellipsoid beam profile. The form of the beam profile, but not the intensity distribution contained therein, is determined in this way. The latter can also be described by any distribution function. In particular, there can be a Gaussian, Lorentz, Voigt or pseudo-Voigt profile, or simply sufficiently inhomogeneous radiation with a relatively low flat-top profile for example. By means of suitable beam transformation, such a starting profile is transformed by reflection on the aspherically curved surface into a homogenous top-hat beam profile according to the invention. The external shape of the beam profile thereby preferably has the form of a rectangle, in particular a square. Other preferred beam profile forms include a circular or linear beam profile. Different beam profiles can also be ellipsoid beam profiles with different ellipse parameters. It is also possible to keep the original ellipsoid beam profile. A further preferred variant is the generation of a free-form profile with any edge contour.

In a preferred configuration of the invention, the radiation reflected in the second direction from the reflective surface is either collimated, focussed or scattered for each beam axis independently. By means of this configuration, additional optical functionalities to the already mentioned beam forming properties of the invention can be achieved during the reflection on the reflective surface. In particular, the function of a suitable lens for the collimation, focussing or scattering of laser radiation can also be implemented directly in the optical arrangement according to the invention.

Further preferred embodiments of the invention are described with the remaining features given in the dependent claims.

The various embodiments of the invention mentioned in this application can be combined with one another advantageously, except when designed differently in individual cases.

BRIEF DESCRIPTION OF THE DRAWING(S)

The invention is explained in the following by example embodiments with reference to the attached figures, wherein.

Figure 5:
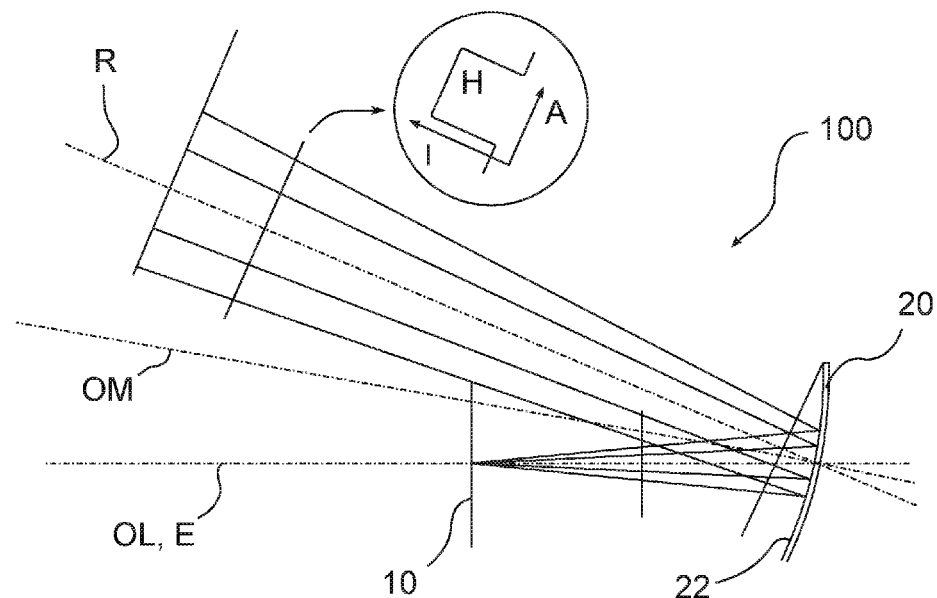
Figure 6:
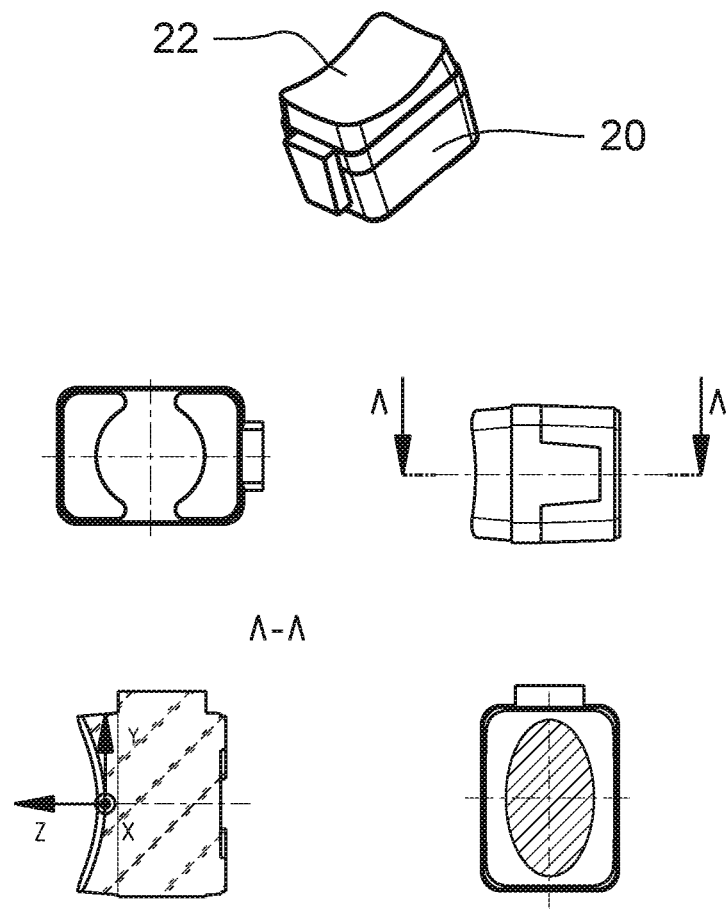
Figure 7A:
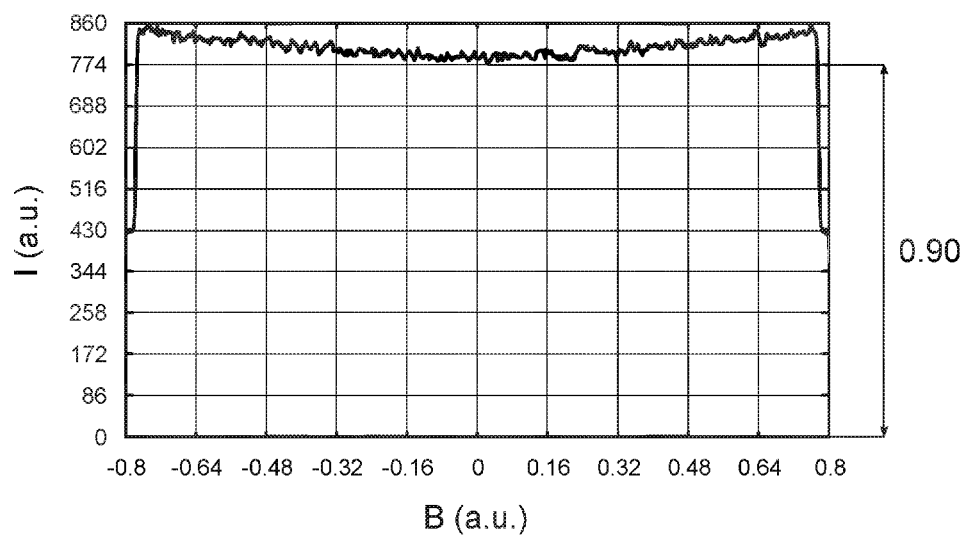
Figure 7B:
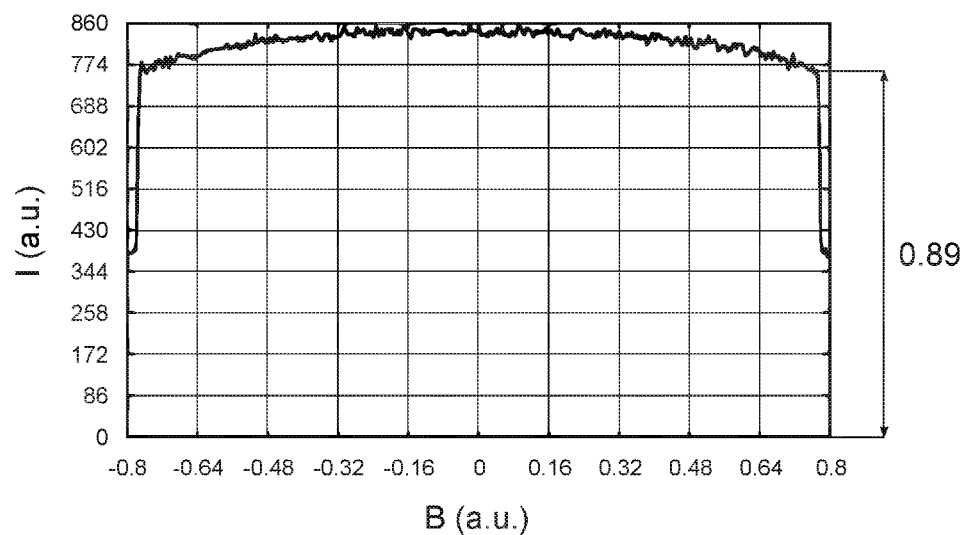

FIG. 5 shows a schematic representation of a scattering beam path in an optical arrangement according to the invention for transforming laser radiation in top view; and FIG. 6 shows a construction drawing of a mirror of a particularly preferred embodiment of a projection system according to the invention; and FIGS. 7a, and 7b show homogenous top-hat beam profiles after transformation in a particularly preferred embodiment of an optical arrangement according to the invention.

DETAILED DESCRIPTION OF THE PREFERRED EMBODIMENT(S)

Figure 1A:
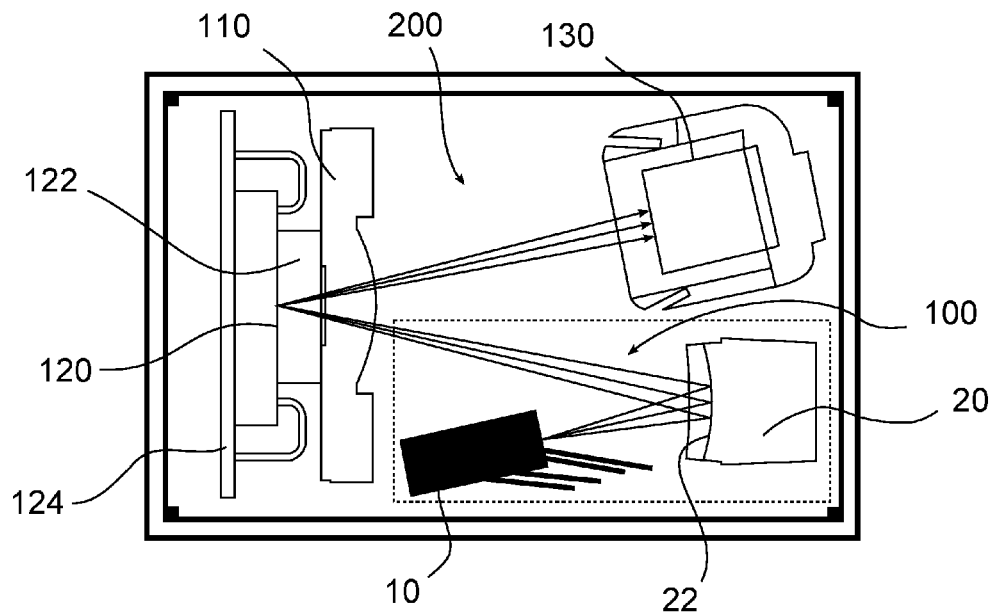
FIG. 1a shows a schematic representation of a projection system in top view according to the invention.

FIG. 1a shows a schematic representation of a projection system 200 according to the invention in top view. The projection system 200 comprises an embodiment according to the invention of an optical arrangement 100 for transforming laser radiation. Here the laser radiation emitted by a laser light source 10, where the beam profile and the intensity distribution therein has an inhomogeneous beam profile according to the description, is transformed by reflection on a mirror 20 with a reflective surface 22 and an aspherical curvature according to the invention adjusted to the beam properties of the laser light source 10 such that there is a homogenous top-hat beam profile H according to the invention. A field lens 110 is also shown in front of a spatial light modulator 120, which can be connected securely to an assembly support 124 by means of an additional cover glass 122 to form a mechanically and also optically stabile and robust component. The field lens 110 is used to focus the beam incidental to the spatial light modulator 120. By means of the field lens 110 the spatial modulated light field is simultaneously mapped onto a projection arrangement 130, which is used for outputting the modulated light field from the projection system 200. The marked schematic beam profiles provide an impression of the folding of the optical beam path, which makes it possible to achieve a particularly compact design for the projection system 200. There are practical limits to the further shortening of the optical paths in particular due to the emission properties of typically used laser light sources 10 and the size of the surface elements to be illuminated.

Figure 1B:
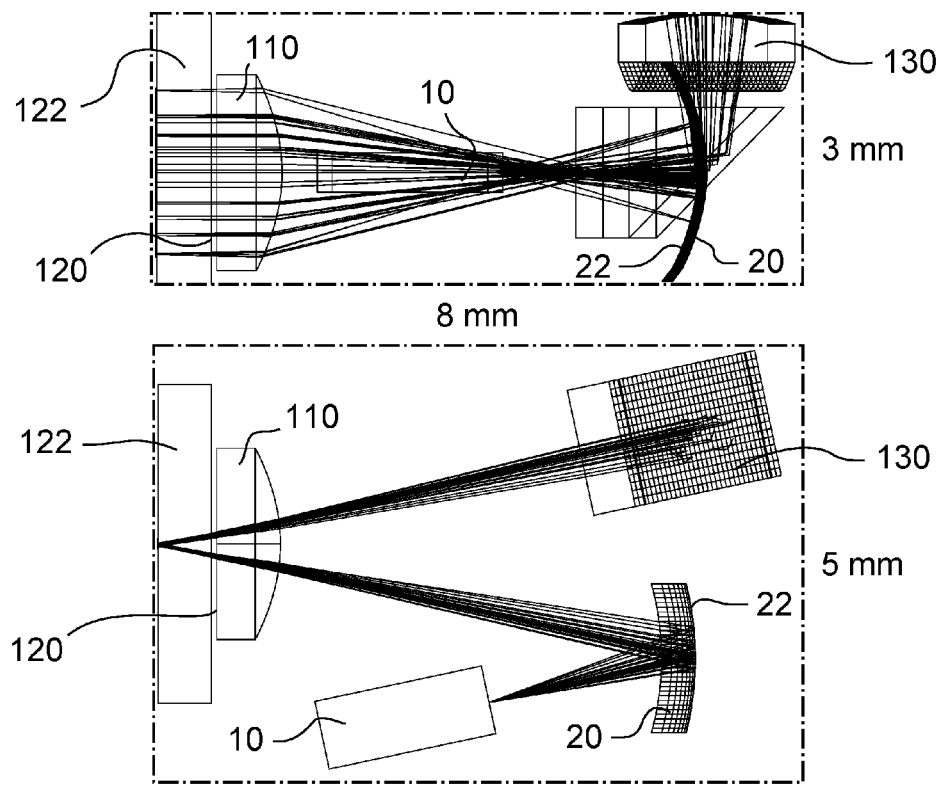
FIG. 1b shows representations of a calculated beam profile in a projection system according to the invention in side view and in top view.

FIG. 1b shows representations of a calculated beam profile in a projection system according to the invention in side view and in top view. The arrangement of the individual components corresponds here substantially to the embodiment shown in FIG. 1a. Therefore, the respective reference numerals are used accordingly. The figure is a complete numerical simulation of such a projection system with the dimensions given in the latter. It should be noted here, particularly in the bottom view, that as a result of the projection arrangement 130, there is a deflection of the main beam direction out of the image plane in the direction of the viewer. Such a deflection of the main beam direction can preferably be performed by a suitable prism arrangement as a projection arrangement 130. Alternatively, however, mirror or lens arrangements are also used as a projection arrangement 130 for radiation output. However, the output can be performed in any other direction, in particular also in the main beam direction of the optical arrangement 100. In the side view, the compact structure of the projection system 200 according to the invention is shown once again.

Figure 2:
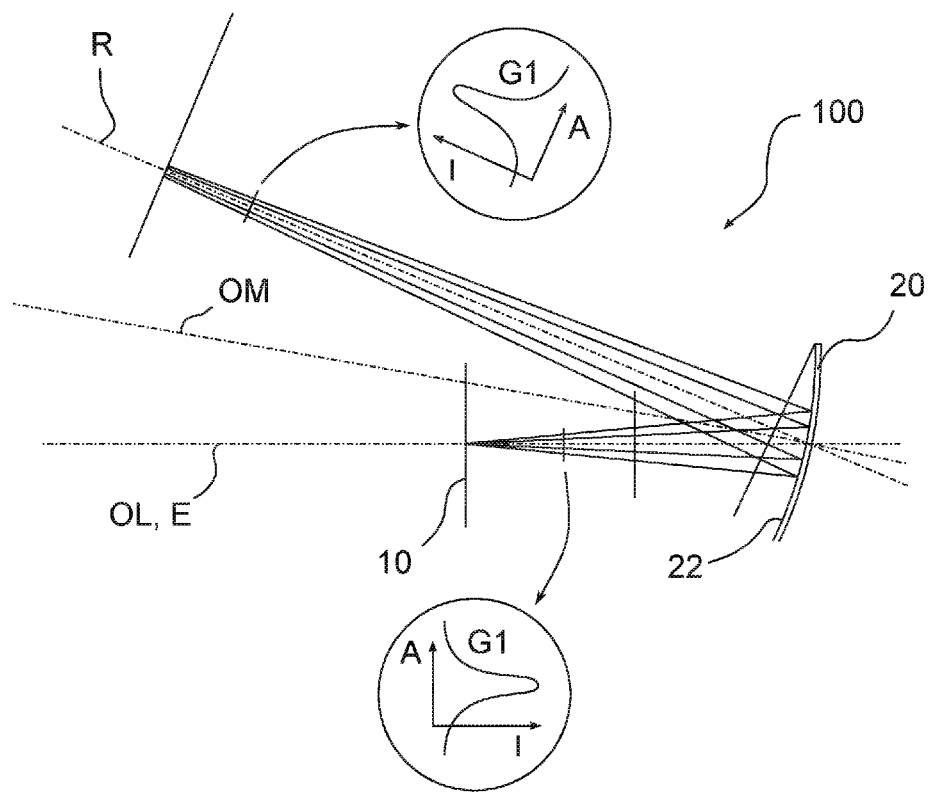
FIG. 2 shows a schematic representation of a focussing beam path in an optical arrangement according to the invention for transforming laser radiation in top view.

FIG. 2 shows a schematic representation in top view of a focussing beam path in an optical arrangement 100 according to the invention for transforming laser radiation. In particular, this can be a top view of an optical arrangement 100 of a projection system 200 according to the invention shown in FIGS. 1a and 1b. To illustrate the beam profile and the local variation of the beam parameters, only one mirror 20 is shown here with a reflective surface 22 in cross-section. Furthermore, the positions of the laser light source 10 and different sections of the optical beam path are shown. The direction of the laser axis OL coincides here precisely with the first direction E, in which the reflective surface 22 of the mirror 20 is radiated. The two directions can also differ however. A reflection of the incidental radiation is performed here symmetrically to a mirror axis OM in the second direction R. In this case the reflective surface is curved aspherically, bi-aspherically or generally aspherically so that in the shown plane the radiation reflected by the reflective surface 22 in the second direction R is focussed for a first beam axis A within this plane. According to the invention, with reflection on the reflective surface 22, the inhomogeneous beam profile G1, G2 of laser radiation, here indicated as Gaussian or approximately Gaussian, is retained for the first beam axis A according to the form. In particular, the indicated mirror 20 can be a mirror 20 with a bi-aspherical curvature with conical sections. In the shown view the reflected beam retains its original profile, but is focussed by the reflection in the reflection direction R. However, for the first beam axis A shown in the drawing by adjusting the corresponding curvature parameter of the reflective surface 22 of the mirror 20, a transformation of the radiated beam profiles is also possible, in particular of an inhomogeneous beam profile G1 into a homogenous top-hat beam profile H with a corresponding spatial distribution of intensity I. Furthermore, embodiments are also preferred in which there is no change to the beam profile, but only to a deflection of the incidental radiation.

Figure 3:
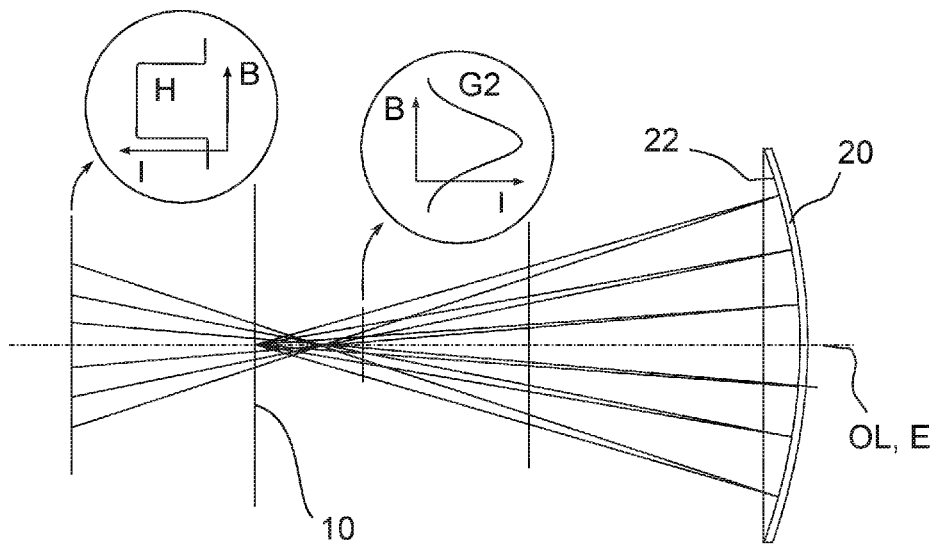
FIG. 3 shows a schematic representation of a focussing beam path in an optical arrangement according to the invention for transforming laser radiation in side view.

FIG. 3 shows a schematic representation in side view of a focussing beam path in an optical arrangement 100 according to the invention for transforming laser radiation. The representation corresponds to a different section of the embodiment described in FIG. 2. In particular, this can be a side view of an optical arrangement 100 of a projection system 200 according to the invention shown in FIGS. 1a and 1b. The allocation of the individual reference numbers applies accordingly to the previous description of the Figures. In the side view here only the beam path is shown along the first direction E, which also coincides with the laser axis OL in this view. As the shown side view is a perpendicular cross section of the view shown in FIG. 2, the profile of the intensity I, given by way of example, relative to the second beam axis B is shown. In particular, compared to the initial profile along the first beam axis A shown in FIG. 2, a much broader distribution of the path of the intensity I is shown here, which is indicated as Gaussian or approximately Gaussian. In the shown embodiment for the second beam axis B, the inhomogeneous beam profile G2 is transformed into a homogenous top-hat beam profile H with a corresponding spatial distribution of the intensity I. In addition, the radiation is focussed in the second direction R (not shown) extending obliquely into the plane of the image. For the second beam axis B, there can also be any other transformation of the incidental beam profile by means of a suitable adjustment of the curvature parameters of the reflective surface 22 of the mirror 20. Furthermore, embodiments are preferred in which for the second beam axis B there is no change to the beam profile. In addition to a simple reflection of the incidental radiation in the first direction E, it is also possible to scatter the radiation reflected from the reflective surface 22 in the second direction R. In all of these embodiments there can also be an additional transformation of the beam profile for the second beam axis B.

Figure 4:
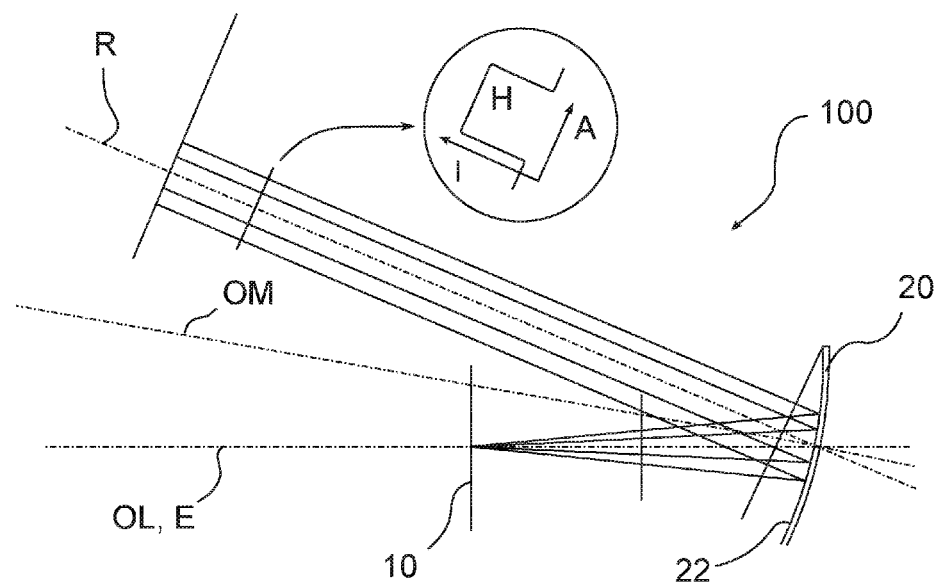
FIG. 4 shows a schematic representation of a collimating beam path in an optical arrangement according to the invention for transforming laser radiation in top view.

FIG. 4 shows a schematic representation in top view of a collimating beam path in an optical arrangement 100 according to the invention for transforming laser radiation. The arrangement of the components corresponds to the embodiment shown in FIG. 2. The same allocation of the individual reference numerals applies accordingly. In this embodiment the beam diameter remains largely constant after reflection on the aspherically curved reflective surface 22 in the second direction R. The reflected beam is homogenised and collimated by the reflection.

FIG. 5 shows a schematic representation in top view of a scattering beam path in an optical arrangement 100 according to the invention for transforming laser radiation. The arrangement of the components corresponds to the embodiments shown in FIGS. 2 and 4. The same allocation of the individual reference numerals applies accordingly. In this embodiment the beam diameter increases after reflection on the aspherically curved reflective surface 22 in the second direction R. The reflected beam is homogenised and scattered by the reflection.

FIG. 6 shows a construction drawing of a mirror 20 in a particularly preferred embodiment of a projection system 200 according to the invention. The latter is in particular a mirror 20, in which the reflective surface 22 in the indicated z-direction in the yz-plane has a particularly preferable aspherical curvature in the form $$z = \frac{cy^2}{1 + \sqrt{1-(1+k)c^2y^2}} + \alpha_1 y^2 + \alpha_2 y^4 + \alpha_3 y^6 + \alpha_4 y^8 + \alpha_5 y^{10} + \alpha_6 y^{12} + \alpha_7 y^{14}, \quad (1)$$

with $c=1/r$. In this case r is the pole radius, a are deformation coefficients, k a conical coefficient, y the respective axis height, and z the respective curve section height (Sagitta). By adapting the individual parameters to a specific laser light source 10 and a desired homogenous top-hat beam profile H, there can be a suitable optimisation of the optical arrangement 100 within the projection system 200. In particular, the shown mirror 20 is part of a specific, particularly preferred embodiment of an optical arrangement 100 according to the invention within the projection system 200. A laser diode is used in single mode operation with an FWHM beam divergence of $(18\pm3)°$ in the rapidly-moving axis and $(8\pm2)°$ in the slow-moving axis as the laser light source 10. The two axes can be assigned directly to a first beam axis A and a second beam axis B. The preferred working range of the laser diode incudes a wavelength range of $(860\pm15)$ nm. The mirror 20 is preferably made of AD5503. The aspherically curved reflective surface 22 can preferably be a conical base shape with a gold coating for maximising reflection at 860 nm. In this embodiment, the beam transformation into a homogenous top-hat beam profile H is performed exclusively in a beam axis. In the second beam axis the present intensity profile remains largely unchanged and there is simply a focussing of the laser radiation. In the beam axis with the top-hat transformation the mirror 20 is preferably described by the aspherical curvature named in Eq. (1) with the aspherical coefficients $r=-1.434$, $k=-2$, $a_2=0.161$, $a_3=-0.328$, $a_4=0.392$, and $a_5=-0.228$. In the focussing beam axis there is preferably a radius of curvature of $r=-2.9$.

FIGS. 7a and 7b show homogenous top-hat beam profiles H after transformation in a particularly preferred embodiment of an optical arrangement 100 according to the invention. In particular, the transformed homogenous top-hat beam profiles H are shown respectively in the second beam axis B after reflection on the aspherically curved reflective surface 22 of the mirror shown in FIG. 6. The optical properties of the used radiation source 10 correspond to the values given in the description for FIG. 6 for the laser diode set for determining the curvature parameters of the reflective surface 22 of the mirror 20 in single mode operation. The two curve profiles show the influence of the tolerance of the FWHM beam divergence respectively in the rapidly moving axis. Whereas in FIG. 7a the homogenous top-hat beam profile H is shown after the transformation of the radiation of a laser diode reflected on the mirror 20 with a maximum tolerance value (+3°), FIG. 7b shows the homogenous top-hat beam profile H of the radiation after the transformation of the radiation of a laser diode reflected on the mirror 20 with a minimum tolerance value (−3°). Within the beam diameter of the homogenous top-hat beam profile H the ratio between minimum and maximum intensity I after reflection on the reflective surface 22 is in this case a maximum of 0.9 and with minimum tolerance is 0.89. However, for a suitable laser diode with zero tolerance (±0°), the distribution curve is flat and the said intensity ratio is 1.0.

What is claimed is:

1. A projection system for generating spatially modulated laser radiation comprising:
    an optical arrangement for transforming laser radiations;
    a field lens;
    a spatial light modulator; and
    a projection arrangement,
    wherein the optical arrangement reflects incidental laser radiation in a first direction (E) on an aspherically curved, reflective surface in a second direction (R),
    wherein in a plane perpendicular to the first direction (E) the laser radiation has an inhomogeneous beam profile (G1, G2) with a first beam axis (A) and a second beam axis (B) perpendicular to the latter, and the aspherical curvature is designed, during the reflection on the reflective surface, to transform the inhomogeneous beam profile of the laser radiation for at least one of the first beam axis (A) and for the second beam axis (B) respectively into a homogenous top-hat beam profile (H).

2. The projection system of claim 1, wherein after reflection on the reflective surface within the beam diameter of the homogenous top-hat beam profile (H), the ratio between minimum and maximum intensity (I) is at least 0.8 for the first beam axis A and for the second beam axis B respectively.

3. The projection system of claim 1, wherein the reflective surface is curved bi-aspherically such that the first aspherical curvature is assigned to the first beam axis (A) and the second aspherical curvature is assigned to the second beam axis (B).

4. The projection system of claim 1, wherein after the reflection of the radiation on the reflective surface, the variance between the divergence of the first beam axis (A) and the second beam axis (B) is less than 0.01.

5. The projection system of claim 1, wherein the reflective surface comprises at least one free-form surface.

6. The projection system of claim 1, wherein along the first beam axis (A) the laser light source (10) has a first Gaussian or approximately Gaussian beam profile (G1) and along the second beam axis (B) it has a second Gaussian or approximately Gaussian beam profile (G2).

7. The projection system of claim 1, wherein the radiation emitted by a radiation source has an ellipsoid beam profile and the radiation reflected by the reflective surface has a rectangular or differing beam profile.

8. The projection system of claim 1, wherein the radiation reflected from the reflective surface in the second direction (R) is either collimated, focussed or scattered for each beam axis (A, B).

9. An optical arrangement for transforming laser radiation, comprising:
 a laser light source which emits laser radiation along a laser axis (OL),
 wherein in a plane perpendicular to the laser axis (OL) the laser radiation has an inhomogeneous beam profile (G1, G2) with a first beam axis (A) and a second beam axis (B) perpendicular to the latter; and
 a reflective surface onto which the laser radiation is directed in a first direction (E),
 wherein the reflective surface is curved aspherically such that the laser radiation is reflected in a second direction (R) and the aspherical curvature is designed, during the reflection on the reflective surface, to transform the inhomogeneous beam profile of the laser radiation for at least one of the first beam axis (A) and for the second beam axis (B) respectively into a homogenous top-hat beam profile (H).

10. The optical arrangement of claim 9, wherein after reflection on the reflective surface within the beam diameter of the homogenous top-hat beam profile (H), the ratio between the minimum and maximum intensity (I) is at least 0.8 for the first beam axis A and for the second beam axis B respectively.

11. The optical arrangement of claim 9, wherein the laser light source comprises a single mode laser and the emitted laser radiation has a minimum divergence for the first beam axis (A) and a maximum divergence for the second beam axis (B) or the divergence for both beam axes is the same.

12. The optical arrangement of claim 9, wherein the reflective surface is curved bi-aspherically such that the first aspherical curvature is assigned to the first beam axis (A) and the second aspherical curvature is assigned to the second beam axis (B).

13. The optical arrangement of claim 9, wherein after the reflection of the radiation on the reflective surface, the variance between the divergence of the first beam axis (A) and the second beam axis (B) is less than 0.01.

14. The optical arrangement of claim 9, wherein the reflective surface comprises at least one free-form surface.

15. The optical arrangement of claim 9, wherein along the first beam axis (A) the laser light source has a first Gaussian or approximately Gaussian beam profile (G1) and along the second beam axis (B) it has a second Gaussian or approximately Gaussian beam profile (G2).

16. The optical arrangement of claim 9, wherein the radiation emitted by the laser light source has an ellipsoid beam profile and the radiation reflected by the reflective surface has a rectangular or differing beam profile.

17. The optical arrangement of claim 9, wherein the radiation reflected from the reflective surface in the second direction (R) is either collimated, focussed or scattered for each beam axis (A, B).

18. The projection system of claim 1, wherein the aspherical curvature is designed, during the reflection on the reflective surface, to transform the inhomogeneous beam profile of the laser radiation for both the first beam axis (A) and the second beam axis (B) respectively into a homogenous top-hat beam profile (H).

19. The optical arrangement of claim 9, wherein the aspherical curvature is designed, during the reflection on the reflective surface, to transform the inhomogeneous beam profile of the laser radiation for both the first beam axis (A) and for the second beam axis (B) respectively into a homogenous top-hat beam profile (H).

* * * * *